US007550990B2

(12) United States Patent
Scarpa et al.

(10) Patent No.: US 7,550,990 B2
(45) Date of Patent: Jun. 23, 2009

(54) METHOD AND APPARATUS FOR TESTING INTEGRATED CIRCUITS FOR SUSCEPTIBILITY TO LATCH-UP

(75) Inventors: Andrea Scarpa, Wijchen (NL); Paul H. Cappon, Wijchen (NL); Peter C. De Jong, Arnhem (NL); Taede Smedes, Beuningen (NL)

(73) Assignee: NXP B.V., Eindhoven (NL)

( * ) Notice: Subject to any disclaimer, the term of this patent is extended or adjusted under 35 U.S.C. 154(b) by 78 days.

(21) Appl. No.: 10/587,645

(22) Filed: Jul. 27, 2006

(65) Prior Publication Data
US 2007/0165437 A1    Jul. 19, 2007

(30) Foreign Application Priority Data
Jan. 28, 2004    (EP) ................... 04100289

(51) Int. Cl.
*G01R 31/26*    (2006.01)
(52) U.S. Cl. ................ 324/769
(58) Field of Classification Search ........ None
See application file for complete search history.

(56) References Cited

U.S. PATENT DOCUMENTS

| | | | | |
|---|---|---|---|---|
| 5,326,994 | A * | 7/1994 | Giebel et al. ............... 257/174 |
| 5,430,595 | A * | 7/1995 | Wagner et al. ............... 361/56 |
| 5,541,547 | A * | 7/1996 | Lam ............... 324/763 |
| 5,825,600 | A * | 10/1998 | Watt ............... 361/56 |
| 6,469,538 | B1 * | 10/2002 | Gupta ............... 324/769 |
| 6,479,871 | B2 * | 11/2002 | Peters et al. ............... 257/355 |
| 6,493,850 | B2 * | 12/2002 | Venugopal et al. ............... 716/4 |
| 6,553,542 | B2 * | 4/2003 | Ramaswamy et al. ............... 716/2 |
| 6,636,067 | B1 * | 10/2003 | Salcedo-Suner ............... 324/765 |
| 6,858,902 | B1 * | 2/2005 | Salling et al. ............... 257/360 |
| 6,985,002 | B2 * | 1/2006 | Salcedo ............... 324/765 |
| 2006/0050453 | A1 * | 3/2006 | Duvvury et al. ............... 361/56 |
| 2006/0215337 | A1 * | 9/2006 | Wu et al. ............... 361/56 |
| 2007/0090392 | A1 * | 4/2007 | Boselli ............... 257/107 |

OTHER PUBLICATIONS

De Manari I et al: "A Test Pattern for Three-Dimensional Latch-Up Analysis"; Microelectronic Test Structures 1993 ICMTS 1993; Proceeedings of the 1993 International Conference on SITGES, Spain Mar. 22-25, 1993; N.Y. USA; IEEE US Mar. 22 1993; pp. 103-109.

Munari De et al: "Design and Simulation of a Test Pattern for Three-Dimensional Latch-Up Analysis"; Microelectronics Journal Mackintosh Publications LTD; Luton GB; vol. 24, No. 7; Nov. 1, 1993; pp. 759-771.

* cited by examiner

*Primary Examiner*—Jermele M Hollington
(74) *Attorney, Agent, or Firm*—Peter Zawilski

(57) ABSTRACT

In an example embodiment, there is a test module for testing the susceptibility of an integrated circuit design to latch-up. The test module comprises a plurality of test blocks, connected in parallel. Each test block includes an injector block for applying a stress current of voltage to the respective test block and a plurality of sensor blocks located at successively increasing distances from the respective injector block. Each sensor block includes a PNPN latch-up test structure. The present invention combines the respective advantages of IC stress current testing and latch-up parameter measurement using a standard PNPN latch-up test structure.

19 Claims, 6 Drawing Sheets

METHOD AND APPARATUS FOR TESTING INTEGRATED CIRCUITS FOR SUSCEPTIBILITY TO LATCH-UP

FIELD OF THE INVENTION

This application is a 371 of PCT/IB05/50347 filed on Jan. 27, 2005.

This invention relates to a method and apparatus for testing integrated circuits for susceptibility to latch-up and, more particularly, to a method and apparatus for testing CMOS, BiCMOS and bipolar integrated circuits for their susceptibility to latch-up, so as to obtain measurements and extract design rules for reducing or eliminating the risk of latch-up occurring in such integrated circuits.

BACKGROUND OF THE INVENTION

Latch-up is a failure of CMOS, BiCMOS and bipolar integrated circuits (ICs) characterized by excessive current drain coupled with functional failure, parametric failure and/or device destruction. Circuits are manually made in silicon by combining adjacent p-type and n-type regions (i.e. overseeded or "doped" with appropriate impurities) into transistors. Paths other than those chosen to form the desired transistor can sometimes result in so-called parasitic transistors which, under normal conditions, cannot be activated. Latch-up occurs as a result of interaction between the parasitic bipolar transistors always present in CMOS, bipolar and BiCMOS devices, caused by a spurious current spike, such that a pair of such parasitic transistors combine into a circuit with large positive feedback.

Referring to FIG. 1 of the drawings, there is illustrated schematically a CMOS inverter, and the desired circuit thereof is illustrated schematically in FIG. 2 of the drawings. The parasitic PNP and NPN transistors form a parasitic PNPN device, in which the collector of the parasitic PNP transistor feeds the base of the parasitic NPN transistor, and the collector of the parasitic NPN transistor feeds the base of the parasitic PNP transistor, as illustrated in the circuit diagram of FIG. 3. When latch-up occurs, a positive feedback takes place, causing a large current flow between the supply voltage line ($V_{DD}$) and the ground line ($V_{SS}$) of the integrated circuit, causing the circuit of FIG. 3 to turn fully on and cause a short circuit across the device, thereby preventing correct operation of the IC and causing discharge of the supply source or burn-up of the IC. Similar combinations of parasitic bipolar devices occur also in BiCMOS and bipolar technologies.

The I-V characteristic of the PNPN configuration illustrated in FIG. 3 is shown in FIG. 4 of the drawings. When a current larger than the trigger current, or a voltage larger than the trigger voltage, is fed to the structure, a snap-back phenomenon occurs in the PNPN parasitic device and the current suddenly increases. When the trigger is removed, the high current continues to flow if the holding voltage is lower than the IC supply voltage. If the holding voltage is larger than the IC supply voltage, the IC is said to be 'latch-up free', because once the above-mentioned trigger is removed, the IC continues to function correctly. The trigger stimulus can originate from several different sources, including, an ESD (electrostatic discharge) pulse during IC operation, a large current or voltage generated by device switching during IC operation, etc. In addition, the trigger current may be generated within the latching structure (of FIG. 3) or it may be generated elsewhere in the circuit and propagate to the latching structure.

During IC development, it is highly desirable to ensure that an integrated circuit is latch-up free, or at least that the maximum current that can reach the parasitic PNPN devices in the integrated circuit is less than the trigger current, in which case, the IC is said to be 'latch-up immune', because latch-up cannot be triggered. Most modem technologies, do not tend to be latch-up free, and as such have to be made latch-up immune.

Typically, integrated circuits are tested for their susceptibility to latch-up in two ways:
  By applying a voltage and/or current stress to the IC input-output pins and then verifying whether such applied stress induces latch-up in the integrated circuit;
  By measuring the latch up parameters (holding voltage, and trigger current and voltage) on special PNPN test modules, in respect of which all diffusions are externally contacted. An example of such a test module is illustrated schematically in FIG. 5 of the drawings, and comprises an IC substrate 1, a P-type well 2 (P-Well), an N-type well 3 (N-Well), a shallow trench isolation (STI) region (or LOCOS) 4, P-Well and N-Well contact diffusions 5 and 6 respectively, an N+ diffusion 7 in P-Well (N+ hot-active), a P+ diffusion 8 in N-Well (P+ hot-active), an inter-level dielectric (ILD) 9 and metal contacts 10 to the PNPN diffusions.

The first method referred to above allows checking as to whether latch-up can be induced in the integrated circuit, having regard to the fact that within given specifications for the maximum stress values, the IC should be latch-up immune. Typically, a current or voltage stress is applied to the IC pins and it is determined whether or not latch-up occurs. This method provides an accurate method of checking the susceptibility of the IC to the occurrence of latch-up, i.e. the risk of the occurrence of latch-up in the IC during operation thereof. However, this test can only be applied very late in the IC market introduction flow, at a time when the IC has already been manufactured. In the case that latch-up occurs (i.e. the IC is determined not to be latch-up immune), it is not possible to discriminate if latch-up has occurred in the input-output circuitry or in the IC circuitry providing the chip required functions (i.e. the IC core), unless failure analysis techniques are employed. In the event that the design or manufacturing process is required to be improved to make the IC latch-up immune, then at this stage in the market introduction flow, the result is a significant additional cost in product development and a delay in the market introduction, which is obviously undesirable and may result in the IC being obsolete by the time it does reach the market. Furthermore, it is not possible using this method to study how latch-up depends on the design of the IC and on the manufacturing process (i.e. junction implants, STI shaping, etc).

The second method referred to above allows the study of the dependency of the latch-up parameters on the manufacturing process and design variables. It is possible to investigate how the latch-up parameters depend on the design by manufacturing different test modules in which the design parameters (such as the distance between hot-actives and well contacts, the distance between hot-actives, etc.) are varied. The dependency of the latch-up parameters on the manufacturing process can be investigated by running split diffusion lots in which some process parameters are varied. Since the PNPN test structures are standard test modules that can be manufactured independently of the IC design, this latch-up study can be performed early in the manufacturing process flow development, well before an IC is taped out and manufactured. Furthermore, the acquired knowledge can be applied to all subsequent IC designs. However, the typical PNPN test structures do not permit study of the effect of a current or voltage stress applied to the IC pins, since the stress testing is carried out directly on the PNPN by applying a stress current or voltage to the N+ hot-active 8 and to the P+ hot-active 9. As only a fraction of the current injected into the IC pins reaches the IC core, using the typical latch-up PNPN test modules leads to over-estimates of the maximum current which will actually reach the IC core. As a consequence, in order to make the IC latch-up immune, unnecessary design rules may be applied, with a resultant negative effect on IC performance and an undesirable increase in chip area.

SUMMARY OF THE INVENTION

We have now devised an improved arrangement, and it is an object of the present invention to provide a method and apparatus for testing integrated circuits for their susceptibility to latch-up in which latch-up can be tested by applying current and voltage stresses relatively early in the manufacturing process flow development of the circuit.

In accordance with the present invention, there is provided a test module for testing the susceptibility of an integrated circuit design to latch-up, the test module comprising a plurality of test blocks, connected in parallel, each test block comprising an injector block for applying a stress current or voltage to the respective test block, and a plurality of sensor blocks located at successively increasing distances from the respective injector block, each sensor block comprising a PNPN latch-up test structure.

The present invention further extends to a method of testing the susceptibility of an integrated circuit design to latch-up, the method comprising providing a test module comprising a plurality of test blocks, connected in parallel, each test block comprising an injector block for applying a stress current or voltage to the respective test block, and a plurality of sensor blocks located at successively increasing distances from the respective injector block, each sensor block comprising a PNPN latch-up test structure, the method further comprising applying a stress current or voltage to one or more of the injector blocks, and obtaining resultant current measurements at one or more of the respective sensor blocks.

Thus, the present invention provides a method and apparatus for testing the susceptibility of an IC design, with the following significant advantages relative to the prior art:

Latch-up can be tested by conventional current and voltage stresses, without requiring the existence of an actual product. As a consequence, potential latch-up issues can be solved before the product tape-out, thus allowing a dramatic saving in development costs and time.

Contrary to the prior art latch-up test method based on the IC test described above, in which a dedicated latch-up test system is required and the IC needs to be packaged, a conventional parameter analyzer is sufficient to carry out the measurement at wafer level, as a result of the present invention.

Furthermore, it is possible to study the latch-up parameter dependency on the process and design variables in a design configuration closely similar to the design of the final IC. This allows for optimization of IC design, by defining proper design rules. As a consequence, the IC area can be reduced and IC performance can be improved, relative to the prior art.

Each test block may be connected to a bondpad, via which a stress current or voltage may be applied to a respective injector block. The injector blocks are preferably connected between first and second supply lines, and the sensor blocks are preferably connected between third and fourth supply lines, different from the first and second supply lines, such that the two blocks can be biased independently, and so that a distinction can be made between the operation of the injector blocks and the sensor blocks during testing Each PNPN latch-up test structure preferably comprises an N+ and a P+ hot-active, which hot-actives are preferably connected to respective probe sensor lines. Heating means may be provided in respect of the PNPN latch-up test structures, and such heating means may, for example, comprise polysilicon rings surrounding each of the PNPN latch-up test structures.

The method of the invention may comprise the steps of disconnecting the sensor blocks during application of the stress current or voltage to the injector blocks, and obtaining current measurements at the injector blocks so as to determine the susceptibility of the injector blocks to latch-up.

An injector block and/or a sensor block may be determined to be susceptible to latch-up if a current measurement thereat exceeds a predetermined threshold. Sequential current measurements are preferably obtained at each PNPN latch-up test structure of a sensor block. Beneficially, each injector block and each sensor block can be independently biased and, in fact, in one embodiment, each PNPN latch-up test structure may be independently biased.

These and other aspects of the present invention will be apparent from, and elucidated with reference to, the embodiments described herein.

DESCRIPTION OF THE DRAWINGS

Embodiments of the present invention will now be described by way of examples only and with reference to the accompanying drawings, in which.

DESCRIPTION OF THE PREFERRED EMBODIMENTS

Figure 6:
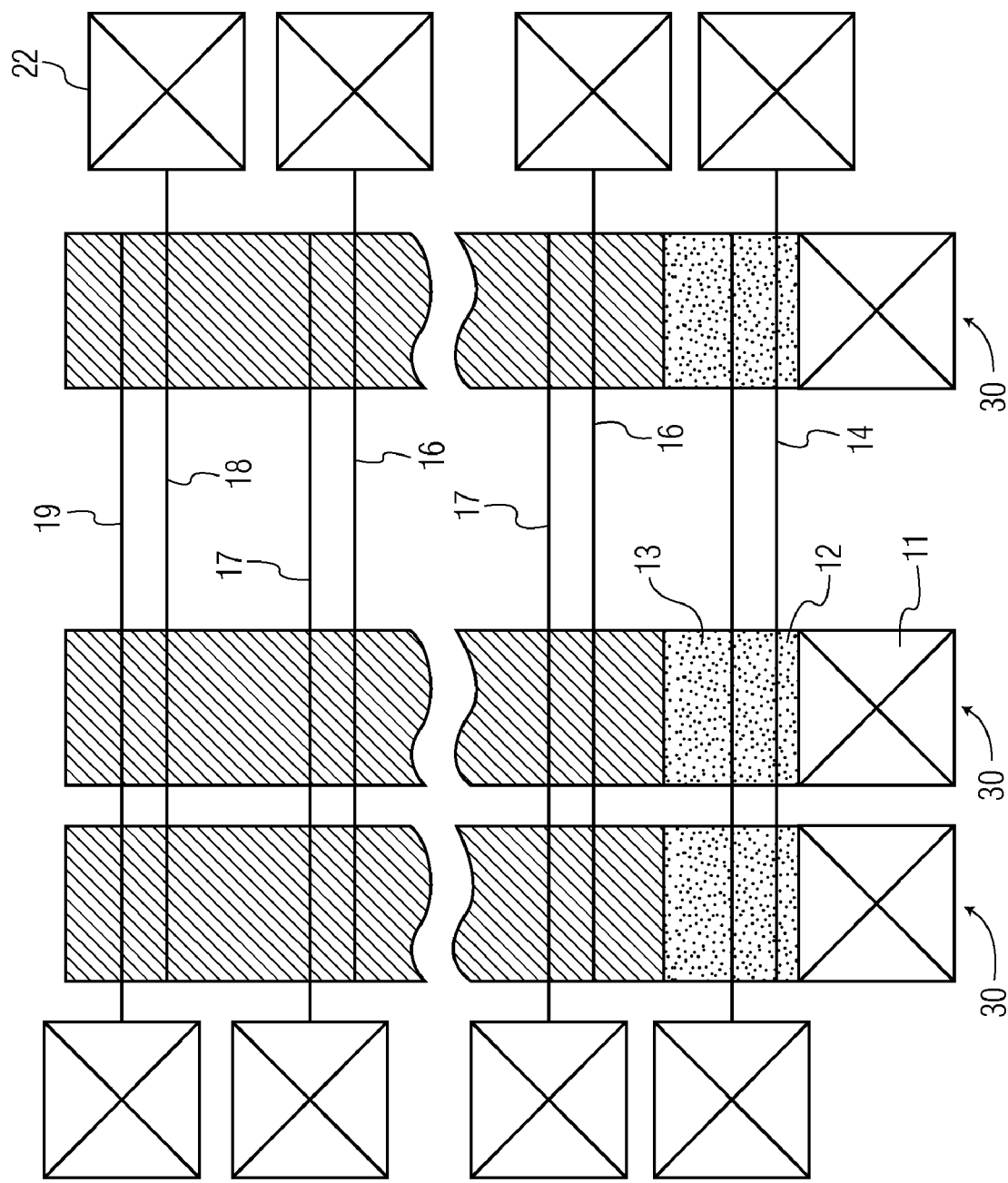
FIG. 6 is a schematic block diagram of a test chip module according to an exemplary embodiment of the present invention.

Referring to FIG. 6 of the drawings, a test chip module according to an exemplary embodiment of the present invention, comprises a plurality of external bondpads 22 connected to respective supply voltage lines 15 and ground lines 14, and a series of test points 30 connected in parallel. Each test point 30 comprises a bondpad 11 to which a respective injector 12 is connected, and to each injector 12 there is connected a sensor block 13. The injectors 12 are intended to generate latch-up stress, and the sensor blocks are for measuring the latch-up susceptibility of the test module. As will be shown, injectors can also be used to test the latch-up susceptibility of I/O blocks.

Figure 7:
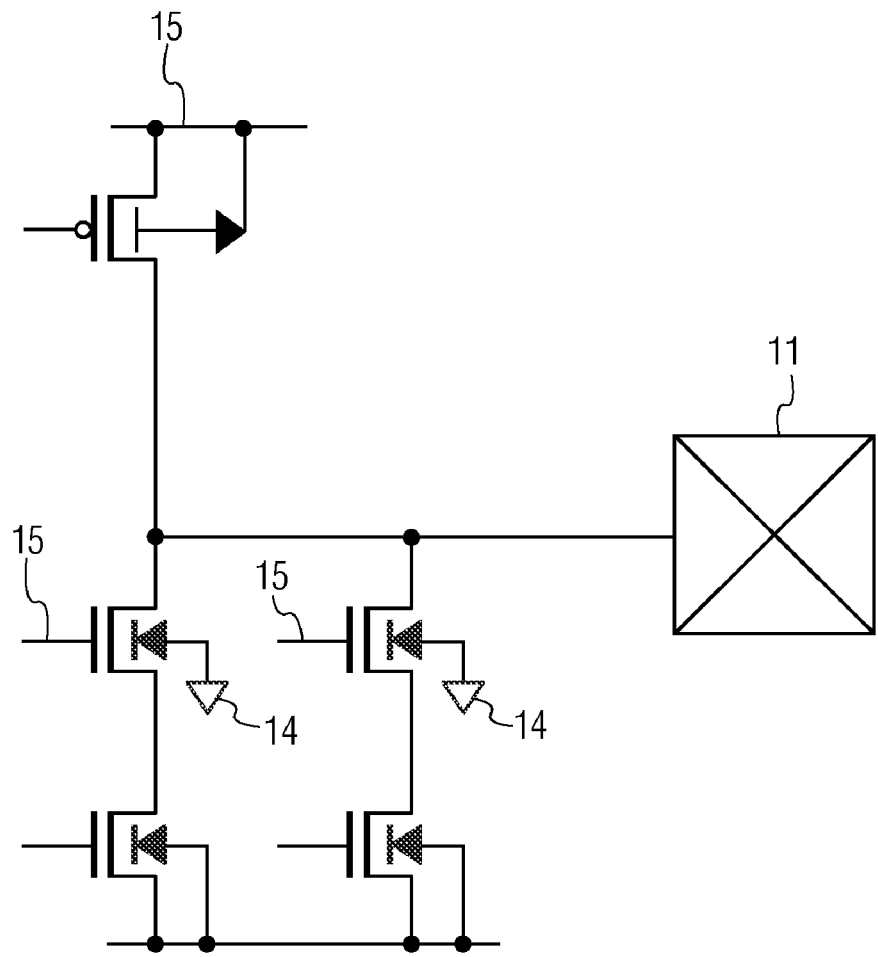
FIG. 7 is a schematic circuit diagram of an exemplary I/O block which can be used as an injector in the test chip module of FIG. 6.

Each injector 12 can simply be a circuit similar to a standard I/O block used in the eventual IC design, and referring to FIG. 7 of the drawings a circuit diagram of an exemplary injector design is illustrated. Of course, it will be appreciated by a person skilled in the art that the injector 12 (or I/O block) can be more complex than that illustrated in FIG. 7, depending on requirements.

By applying a stress voltage or current to the injector bondpad 11, a current is dumped on the test chip substrate, which current diffuses to the respective sensor block 13, where latch-up can be triggered.

Figure 1:
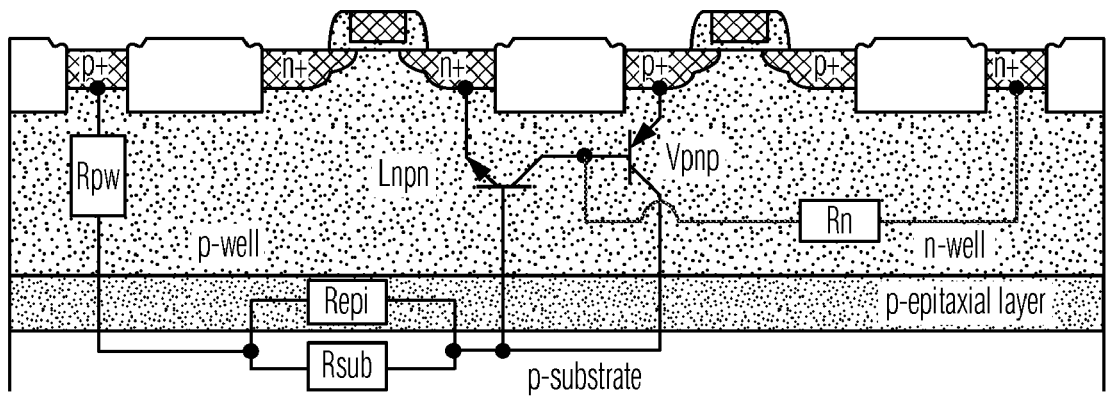
FIG. 1 is a schematic cross-sectional view of an exemplary CMOS integrated circuit illustrating the parasitic bipolar transistors responsible for latch-up.
Figure 2:
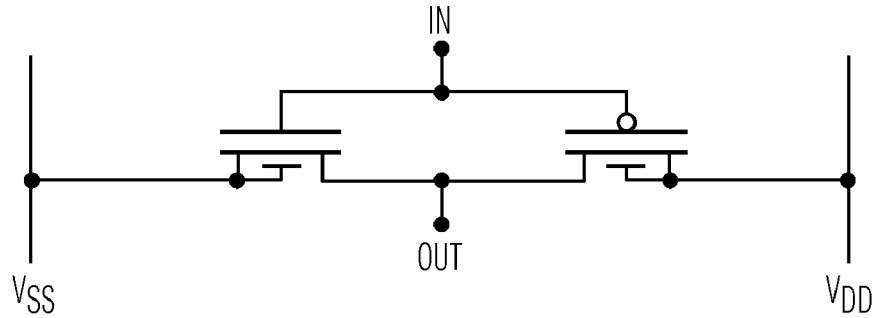
FIG. 2 is a schematic circuit diagram illustrating the desired configuration of the parasitic bipolar transistors in the arrangement of FIG. 1.
Figure 3:
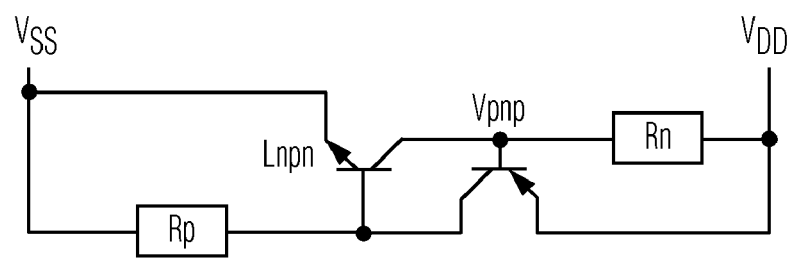
FIG. 3 is a schematic circuit diagram illustrating the configuration of the parasitic bipolar transistors in the arrangement of FIG. 1, as a result of latch-up.
Figure 4:
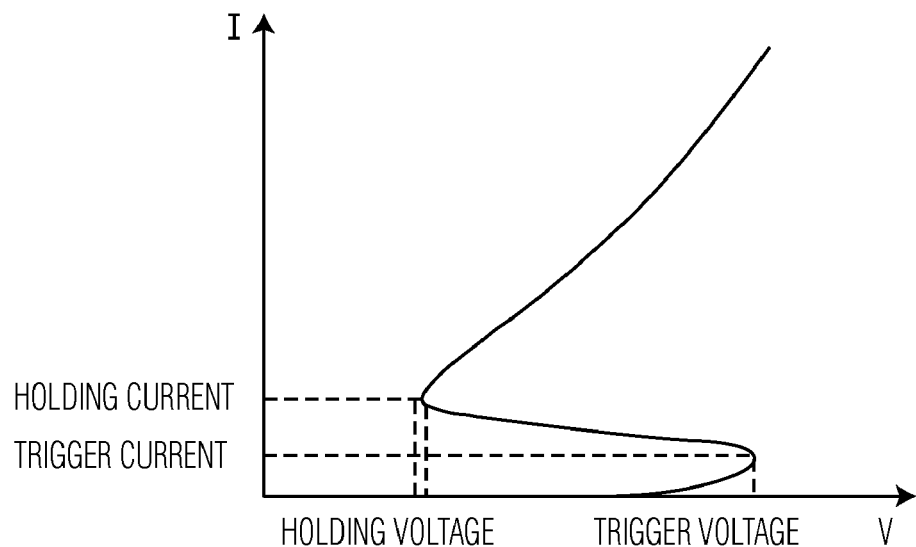
FIG. 4 is a graphical illustration of the I-V characteristics of the arrangement of FIG. 3.
Figure 5:
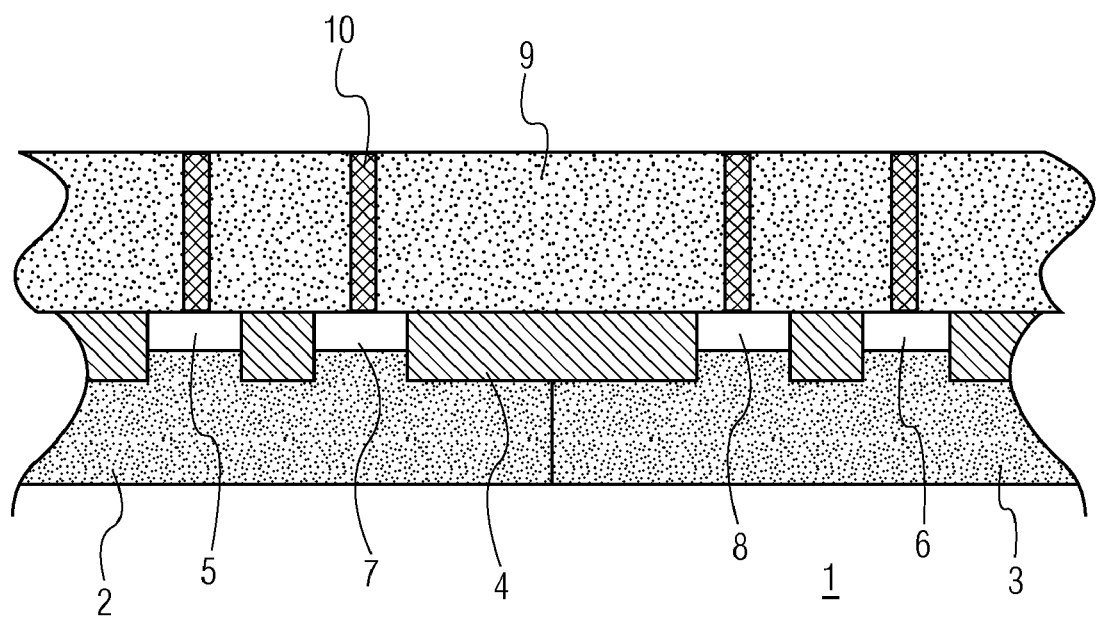
FIG. 5 is a schematic cross-sectional illustration of a PNPN test module according to the prior art.

A sensor block 13 suitable for use in the present invention may consist of several PNPN latch-up test structures of similar construction to the structure illustrated in FIG. 5 of the drawings. Such PNPN test structures are located along the respective sensor block 13 at increasing distances from the injector 12, in order to allow investigation of the effects on latch-up of the distance between the I/O blocks and the IC core.

Figure 8:
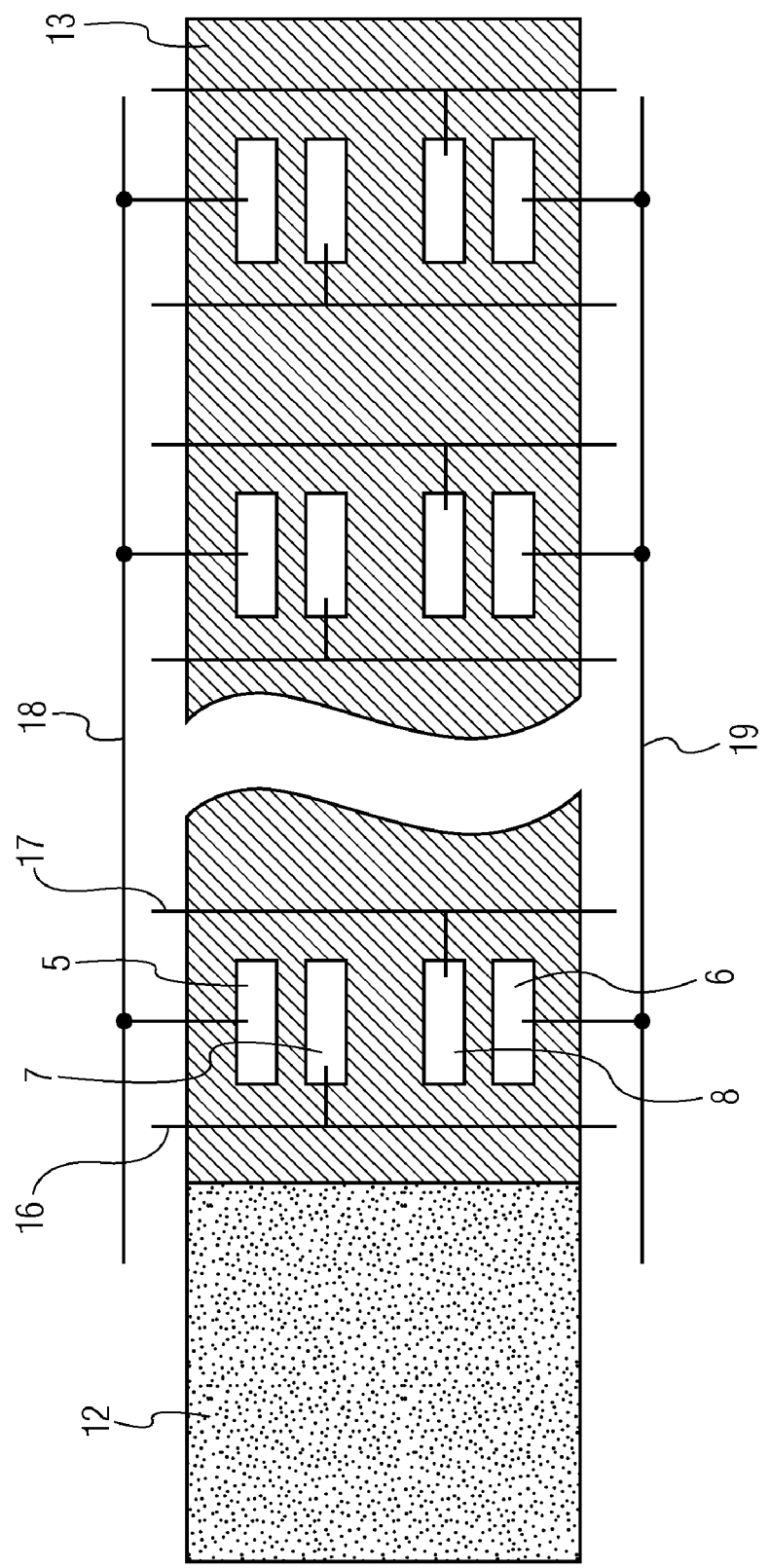
FIG. 8 is a schematic plan view of a first exemplary sensor block which can be used in the test chip module of FIG. 6.

FIG. 8 of the drawings illustrates how a sensor block 13 for use in a first exemplary embodiment of the present invention may be organized. Referring to the drawing, the P-Well and N-Well contacts 5, 6 of each PNPN test structure are biased by ground 18 and supply voltage 19 lines, respectively, which are different to those used for the I/O blocks of the injectors 12, so as to allow the use of different supply voltages and also to permit distinguishing between the possible occurrence of latch-up in the sensor blocks or in the I/O blocks. The N+ and P+ hot-actives 7, 8 of the sensors are connected to the N+ 16 and the P+ 17 probe sensor lines respectively. It will be appreciated by a person skilled in the art that, in order to test for latch-up in respect of each of the sensors placed at different distances from the injector 12, different probe lines will need to be used in respect of each of the different PNPN test structures of a sensor block 13.

Thus, by placing in parallel a set of injector-sensor block couples such as the injector-sensor block couple shown in FIG. 8, as illustrated in FIG. 6, it is possible to investigate the effect on latch-up of different types of injectors. For instance, the effect of different types of guard-rings or guard-bands can be investigated. Ideally, each injector and each sensor would be independently biased and accessed, thereby allowing a full 2D sensitivity picture to be developed. However, in order to save on bondpads and, thus, test-chip area, interconnection lines can be shared by the injector-sensor block couples. For example, the well contacts of the sensors can share the same supply lines (18, 19 respectively for P- and N-Well).

In order to test for the latch-up sensitivity of the I/O blocks, the sensor blocks can be left disconnected during testing. In this case, a current or voltage stress can be applied to the injector bondpad and the latch-up occurrence can be verified by measuring the current flowing to the injector ground and supply voltage lines.

Figure 9:
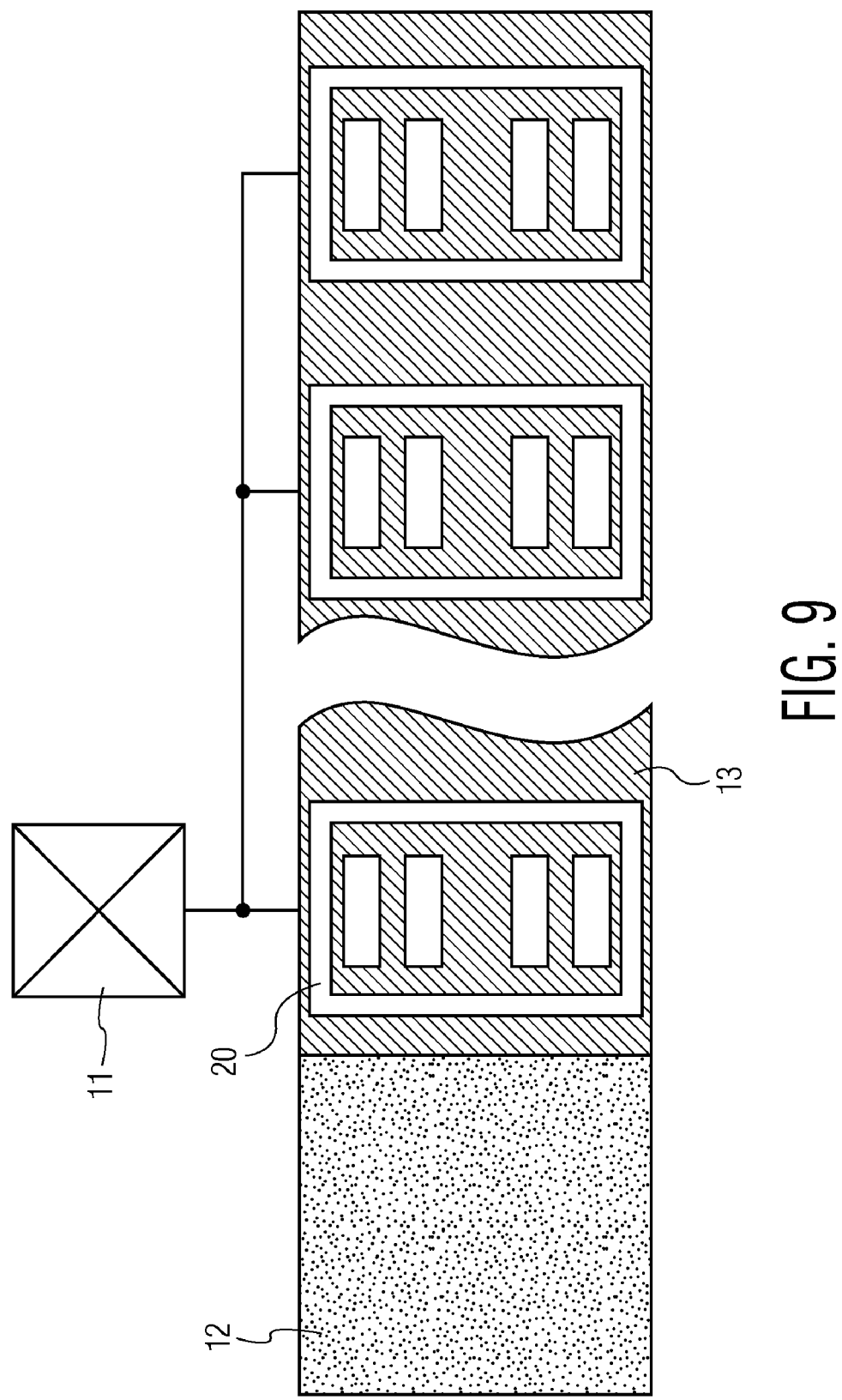
FIG. 9 is a schematic plan view of a second exemplary sensor block which can be used in the test chip module of FIG. 6.

In an alternative structure for the sensor block, as illustrated schematically in FIG. 9 of the drawings, polysilicon rings 20 can be placed around the PNPN test structures. Polysilicon rings 20 act as heaters with respect to the PNPN test structures, thus allowing latch-up at high temperatures to be tested, without the requirement for an external heating source. Similarly, polysilicon rings can be placed in respective I/O blocks to increase injector temperature during testing.

Thus, the latch-up test chip described above is a compact latch-up analysis vehicle that merges the easy testability of the typical PNPN latch-up test structures with the advantages of the IC latch-up test. By applying a current or voltage stress to the injector bondpads, one can investigate the latch-up occurrence in the I/O blocks and in the sensor blocks, by simply measuring the current. When the current measured on the supply voltage or ground lines of the I/O block or of the sensor block is higher than a predetermined threshold, then latch-up is detected. The effect of the distance between the sensors and the injector can be studied by taking sequential measurements at the sensors placed at different distances from the injector. During the measurement at each sensor, the other ones are not biased. The effect of the I/O block design on the latch-up susceptibility of the sensors can also be investigated by sequentially applying the stress to the injectors, while leaving the sensors unbiased.

Design rules to obtain a latch-up immune IC can be identified by means of the latch-up test chip. Since the latch-up stresses are performed in respect of an IC-like design, the resultant design rules are not required to be conservative, as would be the case if the simple prior art PNPN test structure described above is used. This is likely to result in a significant reduction in IC area and an improvement in IC performance relative to prior art devices. Furthermore, an IC-like device can be tested well before the IC tape-out, thereby enabling a dramatic cost reduction with respect to IC development whenever latch-up issues are detected, relative to prior art processes.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A test module for testing the susceptibility of an integrated circuit design to latch-up, the test module comprising:
a plurality of test blocks, connected in parallel, each test block including an injector block for applying a stress current or voltage to the respective test block, and
a plurality of sensor blocks located at successively increasing distances from the respective injector block, each sensor block including a PNPN latch-up test structure.

2. The test module as recited in claim 1, wherein each test block is connected to a bondpad, said stress current or voltage being applied to said injector via said bondpad.

3. The test module as recited in claim 1, wherein said injector blocks are connected between first and second supply lines.

4. The test module as recited in claim 3, wherein contacts of said sensor blocks are connected between third and fourth supply lines, different from said first and second supply lines.

5. The test module as recited in claim 1, wherein each PNPN latch-up structure includes an $N^+$ and a $P^+$ hot-active, which hot-actives are connected to respective probe sensor lines.

6. The test module as recited in claim 1, wherein each of said PNPN latch-up test structures includes a heater.

7. A test module according to claim 6, wherein said heaters comprise polysilicon rings located around respective PNPN latch-up test structures.

8. A method of testing the susceptibility of an integrated circuit design to latch-up, the method comprising:
   providing a test module comprising a plurality of test blocks, connected in parallel, each test block including,
   an injector block for applying a stress current or voltage to the respective test block, and
   a plurality of sensor blocks located at successively increasing distances from the respective injector block, each sensor block including a PNPN latch-up test structure,
   applying a stress current or voltage to one or more of the injector blocks, and
   obtaining resultant current measurements at one or more of the respective sensor blocks.

9. The method as recited in claim 8, further comprising,
   disconnecting said sensor blocks during application of said stress current or voltage to one or more of said injector blocks, and
   obtaining current measurements at said injector blocks to determine the susceptibility thereof to latch-up.

10. The method as recited in claim 8, wherein an injector block or a sensor block is determined to be susceptible to latch-up if a current measurement therein exceeds a predetermined threshold.

11. The method as recited in claim 8, wherein sequential current measurements are obtained at each PNPN latch-up test structure of a sensor block.

12. The method as recited in claim 8, wherein each injector block and each sensor block can be independently biased.

13. The method as recited in claim 12, wherein each PNPN latch-up test structure can be biased independently.

14. A test module comprising:
   a plurality of external bond-pads each connected to respective supply voltage and ground lines;
   a plurality of test points connected in parallel, each of the test points including a bond-pad;
   a plurality of injectors for applying a stress current or volatge, each of the injectors connected to one of the bond-pads of the test points and each of the injectors connected to the respective supply voltage and ground lines of one of the external bond-pads;
   a plurality of sensor blocks each of which is connected to one of the injectors, each of the sensor blocks including a PNPN latch-up test structure for measuring latch-up susceptibility of the test module, the sensor blocks connected to the respective supply voltage and ground lines of another one of the external bond-pads.

15. The test module of claim 14, wherein each of the sensor blocks includes a plurality of PNPN latch-up test structures, the plurality of PNPN latch-up test structures of a respective one of the sensor blocks located at successively increasing distances from the injector connected to the respective one of the sensor blocks.

16. The test module of claim 15, wherein each of the sensor blocks includes a plurality of polysilicon rings each of which is located around one of the plurality of PNPN latch-up test structures, the polysilicon rings adapted to act as heaters.

17. The test module of claim 14, wherein each of the PNPN latch-up test structures includes a P-Well contact that is connected to the ground line of the another one of the external bond-pads and an N-Well contact that is connected to the supply voltage line of the another one of the external bond-pads.

18. The test module of claim 14, wherein each of the PNPN latch-up test structures includes $N^+$ and $P^+$ hot-actives that are connected to respective probe sensor lines.

19. The test module of claim 14, wherein each of the injectors includes a plurality of transistors.

\* \* \* \* \*